(12) United States Patent
Lee et al.

(10) Patent No.: US 7,576,605 B2
(45) Date of Patent: Aug. 18, 2009

(54) LOW POWER OUTPUT STAGE

(75) Inventors: Chong U. Lee, San Diego, CA (US); David Jonathan Julian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/737,678

(22) Filed: Apr. 19, 2007

(65) Prior Publication Data

US 2007/0257827 A1  Nov. 8, 2007

Related U.S. Application Data

(60) Provisional application No. 60/794,039, filed on Apr. 20, 2006.

(51) Int. Cl.
*H03F 3/38* (2006.01)
(52) U.S. Cl. .................. 330/10; 330/207; 330/251; 341/143; 341/177; 341/182; 341/189; 341/190
(58) Field of Classification Search .................. 330/10, 330/207, 251; 341/143, 177, 182, 189, 190
See application file for complete search history.

(56) References Cited

U.S. PATENT DOCUMENTS

| 5,406,284 | A |   | 4/1995  | Lin et al.       |
|-----------|---|---|---------|------------------|
| 5,617,058 | A | * | 4/1997  | Adrian et al. ......... 330/10 |
| 5,687,169 | A |   | 11/1997 | Fullerton        |
| 5,764,696 | A |   | 6/1998  | Barnes et al.    |
| 5,812,081 | A |   | 9/1998  | Fullerton        |
| 5,832,035 | A |   | 11/1998 | Fullerton        |
| 5,907,427 | A |   | 5/1999  | Scalora et al.   |
| 5,952,956 | A |   | 9/1999  | Fullerton        |
| 5,960,031 | A |   | 9/1999  | Fullerton et al. |
| 5,963,581 | A |   | 10/1999 | Fullerton et al. |
| 5,969,663 | A |   | 10/1999 | Fullerton et al. |
| 5,995,534 | A |   | 11/1999 | Fullerton et al. |
| 6,031,862 | A |   | 2/2000  | Fullerton et al. |
| 6,091,374 | A |   | 7/2000  | Barnes           |
| 6,111,536 | A |   | 8/2000  | Richards et al.  |
| 6,133,876 | A |   | 10/2000 | Fullerton et al. |
| 6,177,903 | B1|   | 1/2001  | Fullerton et al. |
| 6,218,979 | B1|   | 4/2001  | Barnes et al.    |
| 6,295,019 | B1|   | 9/2001  | Richards et al.  |
| 6,297,773 | B1|   | 10/2001 | Fullerton et al. |
| 6,300,903 | B1|   | 10/2001 | Richards et al.  |
| 6,304,623 | B1|   | 10/2001 | Richards et al.  |
| 6,351,652 | B1|   | 2/2002  | Finn et al.      |
| 6,354,946 | B1|   | 3/2002  | Finn             |
| 6,400,307 | B2|   | 6/2002  | Fullerton et al. |

(Continued)

FOREIGN PATENT DOCUMENTS

EP    1469594    10/2004

OTHER PUBLICATIONS

International Search Report—PCT/US07/067085—International Search Authority—European Patent Office—Nov. 15,2007.

(Continued)

*Primary Examiner*—Linh V Nguyen
(74) *Attorney, Agent, or Firm*—Dang M. Vo

(57) ABSTRACT

Power consumption of an output stage such as a class-D output stage may depend on the amplitude and the activity of the signal being output. Here, control signals may be generated to independently control coupled switches of the output stage and to provide a tri-state control scheme for the output stage. These control signals may be generated based on durations of different levels of an input signal over one or more periods of time.

91 Claims, 8 Drawing Sheets

U.S. PATENT DOCUMENTS

| | | |
|---|---|---|
| 6,400,329 B1 | 6/2002 | Barnes |
| 6,421,389 B1 | 7/2002 | Jett et al. |
| 6,430,208 B1 | 8/2002 | Fullerton et al. |
| 6,437,756 B1 | 8/2002 | Schantz |
| 6,462,701 B1 | 10/2002 | Finn |
| 6,466,125 B1 | 10/2002 | Richards et al. |
| 6,469,628 B1 | 10/2002 | Richards et al. |
| 6,483,461 B1 | 11/2002 | Matheney et al. |
| 6,489,893 B1 | 12/2002 | Richards et al. |
| 6,492,904 B2 | 12/2002 | Richards |
| 6,492,906 B1 | 12/2002 | Richards et al. |
| 6,501,393 B1 | 12/2002 | Richards et al. |
| 6,504,483 B1 | 1/2003 | Richards et al. |
| 6,512,455 B2 | 1/2003 | Finn et al. |
| 6,512,488 B2 | 1/2003 | Schantz |
| 6,519,464 B1 | 2/2003 | Santhoff et al. |
| 6,529,568 B1 | 3/2003 | Richards et al. |
| 6,538,615 B1 | 3/2003 | Schantz |
| 6,539,213 B1 | 3/2003 | Richards et al. |
| 6,549,567 B1 | 4/2003 | Fullerton |
| 6,552,677 B2 | 4/2003 | Barnes et al. |
| 6,556,621 B1 | 4/2003 | Richards et al. |
| 6,560,463 B1 | 5/2003 | Santhoff |
| 6,571,089 B1 | 5/2003 | Richards et al. |
| 6,573,857 B2 | 6/2003 | Fullerton et al. |
| 6,577,691 B2 | 6/2003 | Richards et al. |
| 6,585,597 B2 | 7/2003 | Finn |
| 6,593,886 B2 | 7/2003 | Schantz |
| 6,606,051 B1 | 8/2003 | Fullerton et al. |
| 6,611,234 B2 | 8/2003 | Fullerton et al. |
| 6,614,384 B2 | 9/2003 | Hall et al. |
| 6,621,462 B2 | 9/2003 | Barnes |
| 6,636,566 B1 | 10/2003 | Roberts et al. |
| 6,636,567 B1 | 10/2003 | Roberts et al. |
| 6,636,573 B2 | 10/2003 | Richards et al. |
| 6,642,903 B2 | 11/2003 | Schantz |
| 6,661,342 B2 | 12/2003 | Hall et al. |
| 6,667,724 B2 | 12/2003 | Barnes et al. |
| 6,670,909 B2 | 12/2003 | Kim |
| 6,671,310 B1 | 12/2003 | Richards et al. |
| 6,674,396 B2 | 1/2004 | Richards et al. |
| 6,677,796 B2 | 1/2004 | Brethour et al. |
| 6,693,571 B2 * | 2/2004 | Melanson et al. ............ 341/143 |
| 6,700,538 B1 | 3/2004 | Richards |
| 6,710,736 B2 | 3/2004 | Fullerton et al. |
| 6,717,992 B2 | 4/2004 | Cowie et al. |
| 6,748,040 B1 | 6/2004 | Johnson et al. |
| 6,750,757 B1 | 6/2004 | Gabig, Jr. et al. |
| 6,759,948 B2 | 7/2004 | Grisham et al. |
| 6,760,387 B2 | 7/2004 | Langford et al. |
| 6,762,712 B2 | 7/2004 | Kim |
| 6,763,057 B1 | 7/2004 | Fullerton et al. |
| 6,763,282 B2 | 7/2004 | Glenn et al. |
| 6,774,846 B2 | 8/2004 | Fullerton et al. |
| 6,774,859 B2 | 8/2004 | Schantz et al. |
| 6,778,603 B1 | 8/2004 | Fullerton et al. |
| 6,781,530 B2 | 8/2004 | Moore |
| 6,782,048 B2 | 8/2004 | Santhoff |
| 6,788,730 B1 | 9/2004 | Richards et al. |
| 6,822,604 B2 | 11/2004 | Hall et al. |
| 6,823,022 B1 | 11/2004 | Fullerton et al. |
| 6,831,508 B2 * | 12/2004 | Shima .................... 330/10 |
| 6,836,223 B2 | 12/2004 | Moore |
| 6,836,226 B2 | 12/2004 | Moore |
| 6,845,253 B1 | 1/2005 | Schantz |
| 6,847,675 B2 | 1/2005 | Fullerton et al. |
| 6,879,878 B2 | 4/2005 | Glenn et al. |
| 6,882,301 B2 | 4/2005 | Fullerton |
| 6,895,034 B2 | 5/2005 | Nunally et al. |
| 6,900,732 B2 | 5/2005 | Richards |
| 6,906,625 B1 | 6/2005 | Taylor et al. |
| 6,907,244 B2 | 6/2005 | Santhoff et al. |
| 6,912,240 B2 | 6/2005 | Kumar et al. |
| 6,914,949 B2 | 7/2005 | Richards et al. |
| 6,917,284 B2 | 7/2005 | Grisham et al. |
| 6,919,838 B2 | 7/2005 | Santhoff |
| 6,922,166 B2 | 7/2005 | Richards et al. |
| 6,922,177 B2 | 7/2005 | Barnes et al. |
| 6,924,700 B2 * | 8/2005 | Taura et al. ................. 330/251 |
| 6,925,109 B2 | 8/2005 | Richards et al. |
| 6,933,882 B2 | 8/2005 | Fullerton |
| 6,937,639 B2 | 8/2005 | Pendergrass et al. |
| 6,937,663 B2 | 8/2005 | Jett et al. |
| 6,937,667 B1 | 8/2005 | Fullerton et al. |
| 6,937,674 B2 | 8/2005 | Santhoff et al. |
| 6,947,492 B2 | 9/2005 | Santhoff et al. |
| 6,950,485 B2 | 9/2005 | Richards et al. |
| 6,954,480 B2 | 10/2005 | Richards et al. |
| 6,959,031 B2 | 10/2005 | Haynes et al. |
| 6,959,032 B1 | 10/2005 | Richards et al. |
| 6,963,727 B2 | 11/2005 | Shreve |
| 6,980,613 B2 | 12/2005 | Krivokapic |
| 6,989,751 B2 | 1/2006 | Richards |
| 7,015,793 B2 | 3/2006 | Gabig, Jr. et al. |
| 7,020,224 B2 | 3/2006 | Krivokapic |
| 7,027,425 B1 | 4/2006 | Fullerton et al. |
| 7,027,483 B2 | 4/2006 | Santhoff et al. |
| 7,027,493 B2 | 4/2006 | Richards |
| 7,030,806 B2 | 4/2006 | Fullerton |
| 7,034,609 B2 * | 4/2006 | Risbo et al. .................... 330/10 |
| 7,042,417 B2 | 5/2006 | Santhoff et al. |
| 7,046,187 B2 | 5/2006 | Fullerton et al. |
| 7,046,618 B2 | 5/2006 | Santhoff et al. |
| 7,057,456 B2 * | 6/2006 | Taura et al. ............. 330/207 A |
| 7,069,111 B2 | 6/2006 | Glenn et al. |
| 7,075,476 B2 | 7/2006 | Kim |
| 7,079,827 B2 | 7/2006 | Richards et al. |
| 7,099,367 B2 | 8/2006 | Richards et al. |
| 7,099,368 B2 | 8/2006 | Santhoff et al. |
| 7,129,886 B2 | 10/2006 | Hall et al. |
| 7,132,975 B2 | 11/2006 | Fullerton et al. |
| 7,145,954 B1 | 12/2006 | Pendergrass et al. |
| 7,148,791 B2 | 12/2006 | Grisham et al. |
| 7,151,490 B2 | 12/2006 | Richards |
| 7,167,525 B2 | 1/2007 | Santhoff et al. |
| 7,170,408 B2 | 1/2007 | Taylor et al. |
| 7,184,938 B1 | 2/2007 | Lansford et al. |
| 7,190,722 B2 | 3/2007 | Lakkis et al. |
| 7,190,729 B2 | 3/2007 | Siwiak |
| 7,206,334 B2 | 4/2007 | Siwiak |
| 7,209,724 B2 | 4/2007 | Richards et al. |
| 7,230,980 B2 | 6/2007 | Langford et al. |
| 7,239,277 B2 | 7/2007 | Fullerton et al. |
| RE39,759 E | 8/2007 | Fullerton |
| 7,256,727 B2 | 8/2007 | Fullerton et al. |
| 7,271,779 B2 | 9/2007 | Hertel |
| 7,279,965 B2 * | 10/2007 | Hansen et al. ................. 330/10 |
| 7,286,009 B2 * | 10/2007 | Andersen et al. ............... 330/10 |
| 7,348,840 B2 * | 3/2008 | Magrath et al. ............... 330/10 |
| 2004/0207465 A1 * | 10/2004 | Nilsson ....................... 330/10 |
| 2006/0028272 A1 * | 2/2006 | Ozawa et al. ............... 330/251 |
| 2006/0208794 A1 * | 9/2006 | Morishima .................... 330/10 |

OTHER PUBLICATIONS

Magrath A J et al: "Hybrid pulse width modulation/sigma delta modulation power digital-to-analogue converter" IEEE Proceedings: Circuits devices and systems, Institution of Electrical Engineers, Stenvenage, GB, vol. 143, No. 3, Jun. 10, 1996, pp. 149-156, XP006006113.

* cited by examiner

LOW POWER OUTPUT STAGE

CLAIM OF PRIORITY UNDER 35 U.S.C. §119

This application claims the benefit of and priority to commonly owned U.S. Provisional Patent Application No. 60/794,039, filed Apr. 20, 2006, entitled, "DIRECT DRIVE CLASS-D AMPLIFIER FROM PULSE WIDTH MODULATION," the disclosure of which is hereby incorporated by reference herein.

BACKGROUND

1. Field

This application relates generally to data communication, and to a low power output stage.

2. Background

Various circuit topologies may be used in an output stage of a communication system. In a typical application a load such as a speaker or an antenna may be driven by an amplifier of a particular class, depending on the requirements of the application. For example, a class-A amplifier may be used in applications that may require relatively good linearity but may not require high-efficiency. Class-C amplifiers, on the other hand, provide much greater efficiency at the cost of higher distortion in the output signal. Another class of amplifier, a class-D amplifier, utilizes a switching architecture to provide high-efficiency and is often used in pulse width modulation-related and sigma delta modulation-related applications.

FIG. 1 illustrates a typical implementation of a class-D amplifier circuit 100 for a digital audio application. In this example, a digital audio input signal 102 is converted to a 1-bit sigma delta modulated stream by a sigma delta modulator 104. A 1-bit digital-to-analog converter 106 converts this bitstream into an analog signal that is, in turn, filtered by a low pass filter 108. A comparator 110 compares the reconstructed analog output of the low pass filter 108 with the output of a sawtooth waveform generator 112. A resulting pulse width modulated signal 114 controls a pair of coupled transistors 116 that alternately drive a speaker 118 depending on the level (high or low) of the pulse width modulated signal 114.

A class-D amplifier circuit such as the one depicted in FIG. 1 may provide a relatively efficient output stage because only one of the transistors 116 is on at a given time. In practice, however, the power consumed by the components that generate the pulse width modulated signal 114 (e.g., components 110 and 112) may be relatively significant, particularly in low power applications.

In some applications a sigma delta modulated signal may be used to directly drive the output stage (e.g., the transistors 116). Such a circuit may reproduce the original signal in a relatively accurate manner if appropriate filtering is provided either before or at the output stage. For example, such a circuit may utilize a filter (e.g., a capacitor) prior to the output stage or the load (e.g., a speaker coil) may provide a sufficient filtering effect.

SUMMARY

A summary of sample aspects of the disclosure follows. It should be understood that any reference to aspects herein may refer to one or more aspects of the disclosure.

The disclosure relates in some aspects to a low power output stage. For example, the power consumption of an output stage constructed in accordance with the teachings herein may depend on (e.g., may be proportional to) the amplitude and the activity of the signal being output.

The disclosure also relates in some aspects to techniques for controlling switches of an output stage. For example, these techniques may be used to drive a switching-based output stage such as a class-D output stage. The output stage may, in turn, drive a load such as a transducer (e.g., a speaker, an antenna, etc.) or some other suitable load.

In some aspects the switches may be controlled based on durations of different levels of an input signal over one or more periods of time. For example, if the duration of a first level (e.g., a high-level) of the input signal is longer than the duration of a second level (e.g., a low-level) of the input signal over a given period of time, a first switch may be turned on. Conversely, if the duration of the second level is longer than the duration of the first level over the period of time, a second switch may be turned on. Thus, one of the switches may be turned on and the other switch turned off, depending on the relative durations of the levels of the input signal.

The disclosure also relates in some aspects to providing a tri-state control scheme. For example, in the event the durations of the levels of the input signal are equal or substantially equal, all of the switches may be turned off. This is in marked contrast with a conventional sigma delta modulation class-D scheme (e.g., as in FIG. 1) where one of the transistors is always on. Such a tri-state control scheme may advantageously be used in conjunction with an input signal where an even distribution of different levels over a given period of time indicates that the corresponding analog signal is at or near a zero level. As an example, in a sigma delta modulated audio signal, silence over a given period of time may be represented by an even distribution of ones and zeros over that period of time.

In conjunction with the tri-state control scheme, independent control signals may be used to control the switches of an output stage. In other words, a unique control signal may be used to independently control a unique one of the switches. For example, in an application that has two switches, a first control signal may be used to independently turn a first one of the switches on and off while a second control signal may be used to independently turn a second one of the switches on and off.

Through the use of an output stage control scheme as taught herein, the power consumed by an output stage may be substantially proportional, in one or more aspects, to the volume and the activity of the signal to be output. For example, when the volume associated with an audio signal is very low (e.g., when the levels of the input signal are evenly distributed), the output stage will consume little or no power since all of the transistors of the output stage may be turned off. In contrast, when the audio volume is high (e.g., when the duration of one level of the input signal is much longer than the duration of another level of the input signals), the output stage will draw a sufficient amount of power to provide the desired volume level.

BRIEF DESCRIPTION OF THE DRAWINGS

These and other features, aspects and advantages of the disclosure will be more fully understood when considered with respect to the following detailed description, appended claims and accompanying drawings, wherein:

Figure 1:
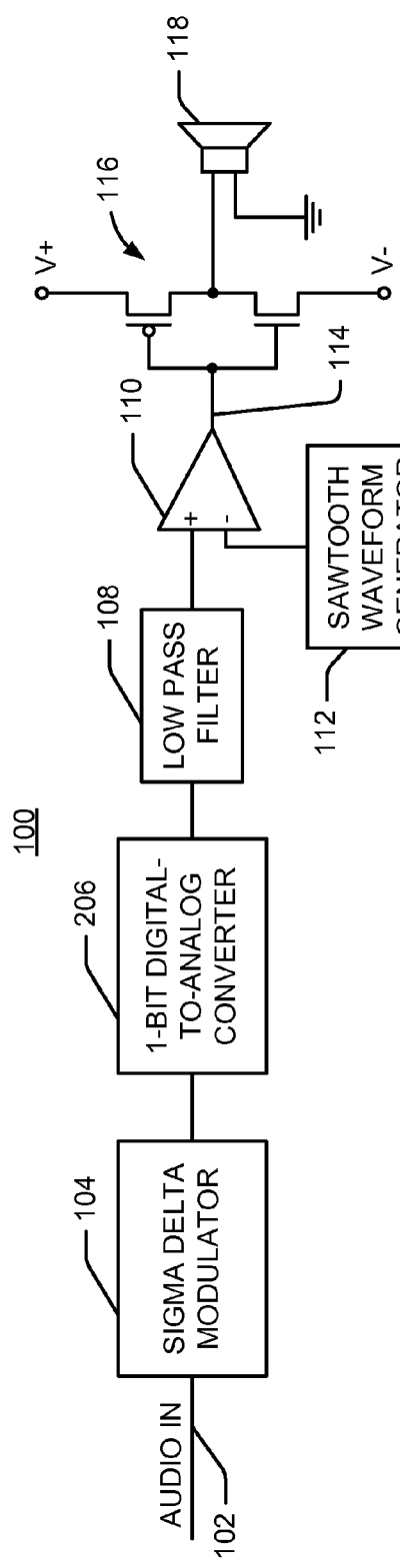
FIG. 1 is a simplified block diagram of an example of a conventional class-D amplifier.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Various aspects of the disclosure are described below. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of the above, in some aspects a method of controlling switches involves determining at least one difference associated with time durations of different levels of an input signal over at least one period of time and generating control signals based on the at least one difference, wherein the control signals independently control the switches. In addition, in other aspects a method of controlling switches also involves turning off the switches if the durations are identical or substantially identical.

Figure 2:
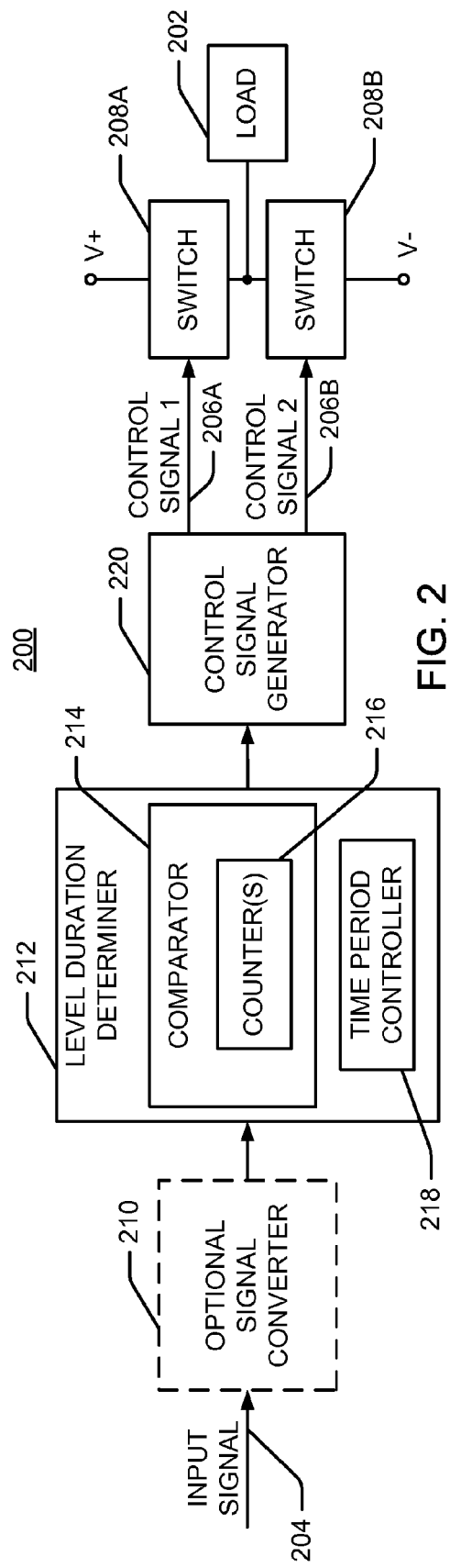
FIG. 2 is a simplified block diagram of several sample aspects of an apparatus for generating control signals to control coupled switches.

FIG. 2 illustrates sample aspects of an apparatus 200 that drives a load 202 according to an input signal 204. In particular, the apparatus 200 generates tri-state control signals 206A and 206B that independently control switches 208A and 208B to drive the load 208. In some aspects, the control signals 206A and 206B are generated based on the durations of the different levels of the input signal 204 over one or more periods of time.

Sample operations of the apparatus 200 will be discussed in conjunction with the flowchart of FIG. 3. For convenience, the operations of FIG. 3 (or any other operations discussed or taught herein) may be described as being performed by specific components. It should be appreciated, however, that these operations may be performed by other types of components and may be performed using a different number of components. It also should be appreciated that one or more of the operations described herein may not be employed in a given implementation.

Figure 3:
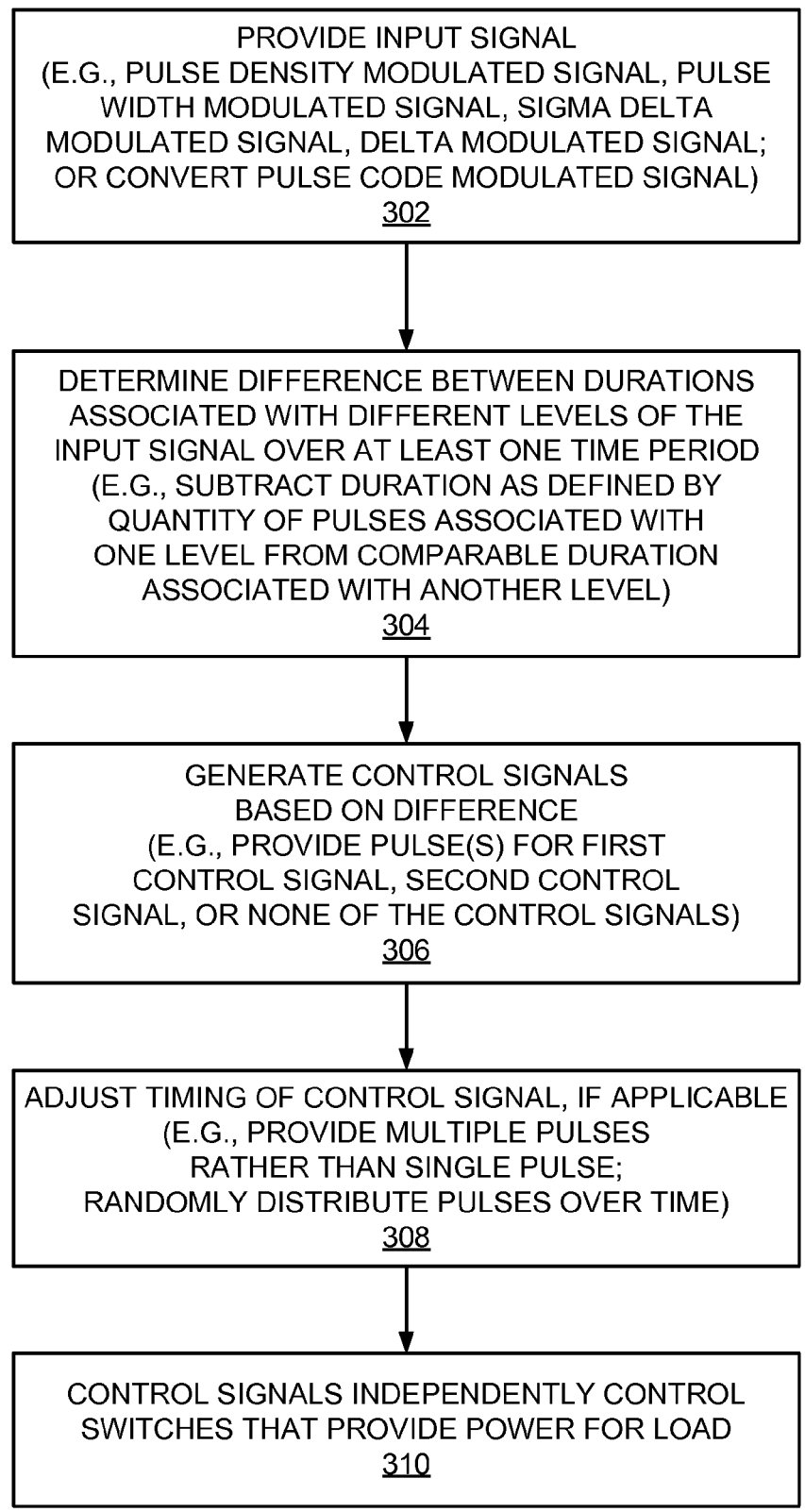
FIG. 3 is a flowchart of several sample aspects of operations that may be performed to generate control signals to control coupled switches.

As represented by block 302 in FIG. 3, initially an input signal 204 is provided in a form that needs to be processed to be provided to the load 202. In some aspects the input signal 204 is a digital signal that has a characteristic whereby durations of certain levels of the input signal 204 relate to amplitude of a signal to be output at the load 202. For example, the input signal 204 may comprise a pulse density modulated signal having a characteristic whereby any imbalance between the number of zeros and ones of the signal during a given period of time corresponds to a magnitude of the represented analog signal. In some implementations the input signal 204 may comprise a sigma delta modulation signal.

It is also possible that other types of input signals (e.g., generated using other types of modulation) may be utilized in conjunction with the apparatus 202. For example, the input signal 204 may comprise other types of pulse density modulated signals such as pulse width modulated signals, or may comprise some form of delta modulated signal (e.g., an adaptive differential pulse code modulated signal).

In some aspects the input signal 204 may comprise two or more levels. For example, an input signal may have levels defined as levels 0 and 1; levels −1 and +1, levels −1, 0, and +1; levels 0, 1, and 2; and so on. Thus, the input signal 204 may comprise a multi-level scheme such as multi-bit sigma delta modulation or multi-bit differential pulse code modulation. In implementations that utilize such schemes, the generation of the control signals may be based on whether there are one or more differences associated with the durations of the different levels of the input signal.

In some implementations the apparatus 202 may optionally include a signal converter 210. For example, the input signal 204 may comprise a pulse code modulated signal (e.g., a 16 bit PCM signal). In this case, the signal converter 210 may convert the pulse code modulated signal 204 to a form suitable for the apparatus 200. For example, in some implementations the signal converter 210 is adapted to generate a sigma delta modulated signal.

It should be appreciated that the input signal 204 may represent any of various types of information. For example, the input signal 204 may represent audio signals, various forms of sensed signals, radio frequency ("RF") signals, or some other type of signal.

As represented by block 304 in FIG. 3, the input signal is provided to a level duration determiner 212 that determines whether there is a difference between the durations associated with different levels of the input signal over least one period of time. This process may involve, for example, determining the duration of each level of the input signal and then comparing the levels to determining whether one of the levels is longer than the other level (or levels). This process also may involve determining the magnitude of the difference between the durations of the different levels. To this end, the level duration determiner 212 may include a comparator 214 adapted to generate an indication relating to any difference between the durations of the levels.

Various techniques may be employed to determine the duration associated with each level of the input signal 204. As will be discussed in more detail below, when the input signal 204 comprises a quantized signal (e.g., a series of pulses or bits representing a particular value such as 1, 0, and so on) the duration associated with a given level may be determined by one or more counters 216 that count the number of bits associated with that level. In contrast, when the input signal 204 comprises a non-quantized signal (e.g., a pulse width modulated signal), the duration associated with a given level may be determined by measuring the width of that level (e.g., using a timer or some other suitable technique).

It should be appreciated that an indication relating to any difference between the durations of the levels may be generated in a variety of ways. In some implementations the comparator 214 may compare the determined levels to generate the indication. For example, when the input signal 204 comprises a series of pulses and there are pulses associated with at least two levels during a given time period, the comparator 214 may simply subtract the number of pulses associated with one level from the number of pulses associated with another level or other levels.

In some implementations the level duration determiner 212 may not explicitly determine the actual duration of each level. Instead, the comparator 214 may directly generate an indication as to the relative difference between the durations of the levels. As an example, the comparator 214 may subtract some characteristic associated with the duration of one level from a characteristic associated with the duration of another level to provide an appropriate indication. This may be accomplished with a quantized input signal by, for example, counting up based on the pulses associated with one level and counting down based on pulses associated with another level. Similarly, this may be accomplished with a non-quantized input signal by, for example, increasing a variable (e.g., a magnitude of a signal) based on timing of one level and decrementing the variable based on timing of another level.

The level duration determiner 212 also may include a time period controller 218 that may be used to define or otherwise control the time period or time periods during which each level determination is made. The time period controller 212 may define a period of time in various ways.

In some implementations a period of time is defined as the time between N successive transitions of the same type in the input signal 204, where N may be 1, 2, 3, and so on. For example, the period of time may be defined as the time from one transition from a first level (e.g., level 0) to a second level (e.g., level 1) to the next transition (if N=1) from the first level to the second level. Here, it should be appreciated that with an input signal having more than two levels, a transition may be defined between any set of levels (e.g., level 0 to level 1, little 0 to level 2, level 1 to level 2, and so on). In the above implementations, the period of time may be nondeterministic. That is, the duration of the period of time may vary in a relatively unpredictable manner based on the particular data represented by the input signal 204.

Alternatively, some implementations may use a defined (e.g., a deterministic) period of time. For example, the level duration determiner 212 may analyze the durations of the levels of the input signal 204 at successive time intervals each of which is of a known (e.g., the same) duration.

As will be discussed in more detail below, the level duration determiner 212 may determine the durations of levels of the input signal during more than one period of time. For example, the level duration determiner 212 may utilize multiple windows of time that may be of different durations, may be offset from one another, and may in some cases overlap with one another.

Referring again to FIG. 3, as represented by block 306 a control signal generator 220 may generate the control signals 206A and 206B based on the indication relating to any difference between the durations of the pulses as provided by the level duration determiner 212. As will be discussed in more detail below, this may involve, for a given period of time, generating one or more signals for the control signal 206A or for the control signal 206B, or not generating a signal for either of the control signals 206A and 206B.

As represented by block 308, the control signal generator 220 may adjust the timing of the control signals 206A and 206B under certain circumstances. For example, the control signal generator 220 may adjust the timing of a signal to avoid turning both of the switches 208A and 208B on at the same time, to spread out the signals in time (e.g., use multiple smaller pulses rather than a single larger pulse), to randomly distribute the signals in time, or for some other reason.

As represented by block 310, the control signals 206A and 206B generated by the control signal generator 220 may independently control the switches 208A and 208B to provide power to the load 202, as necessary. Here, the switch 208A may be turned on to couple the V+ power source to the load, the switch 208B may be turned on to couple to the V− power source to the load 202, or neither of the switches 208A and 208B may be turned on.

Figure 4:
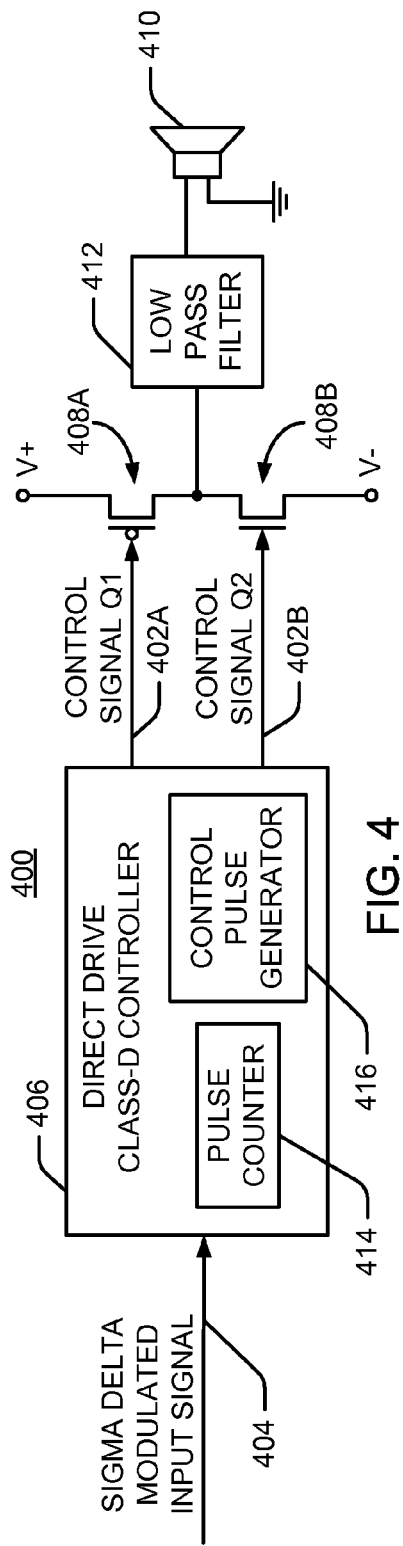
FIG. 4 is a simplified block diagram of several sample aspects of an apparatus for generating control signals to control coupled switches.

Referring now to FIG. 4, additional details relating to controlling coupled switches to provide power to a load will be discussed in the context of an apparatus 400 that generates control signals 402A and 402B based on a sigma delta modulated input signal 404. Sample operations of the apparatus 400 will be discussed in conjunction with the timing diagram of FIG. 5 and the flowchart of FIG. 6. It should be appreciated that the details to follow are provided for illustrative purposes and that the teachings herein are not limited to these specific details.

Figure 5:
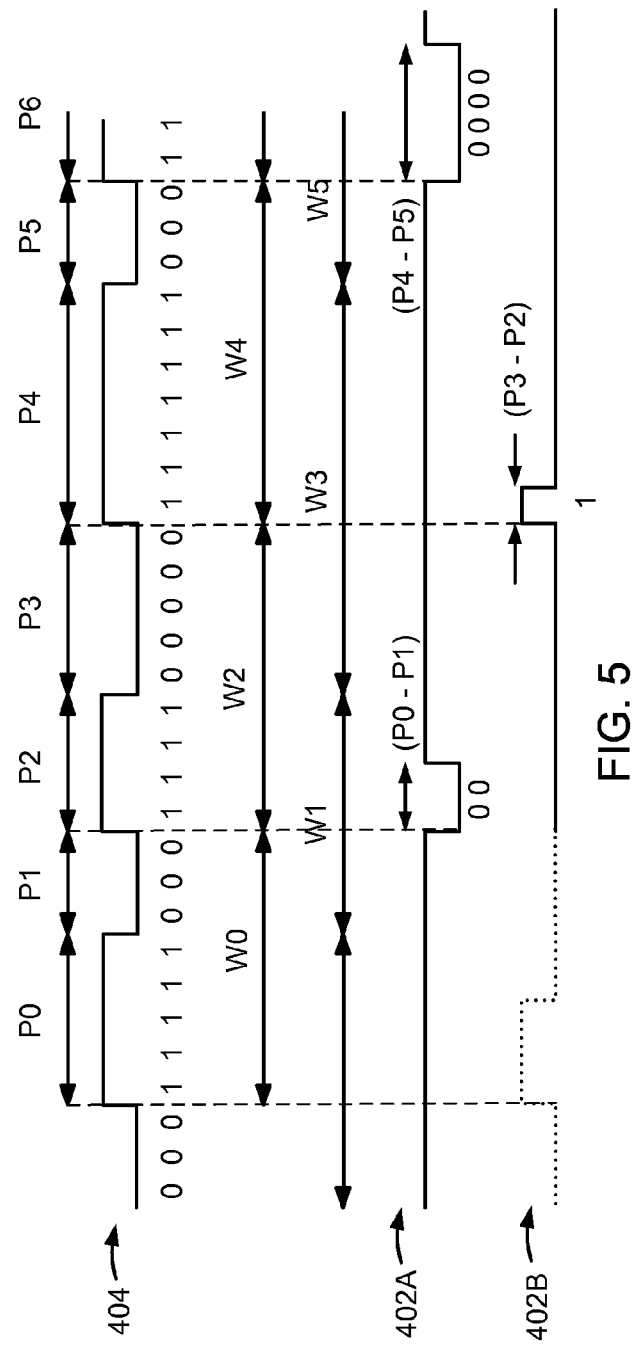
FIG. 5 is a simplified diagram of several sample waveforms relating to the generation of control signals.

In the example of FIG. 4, a direct drive class-D controller 406 generates the control signals 402A and 402B that control a pair of switches 408A and 408B. The switches 408A and 408B may comprise transistors or some other suitable mechanism for coupling power or some other signal to a load 410. As depicted in FIG. 4, in some implementations the switches 408A and 408B are coupled to the load 410 via a low pass filter 412. Referring briefly to FIG. 5, the generation times and the widths of the control signals 402A and 402B may be based on differences between the widths of successive levels of one and zeros in the input signal 404.

Figure 6:
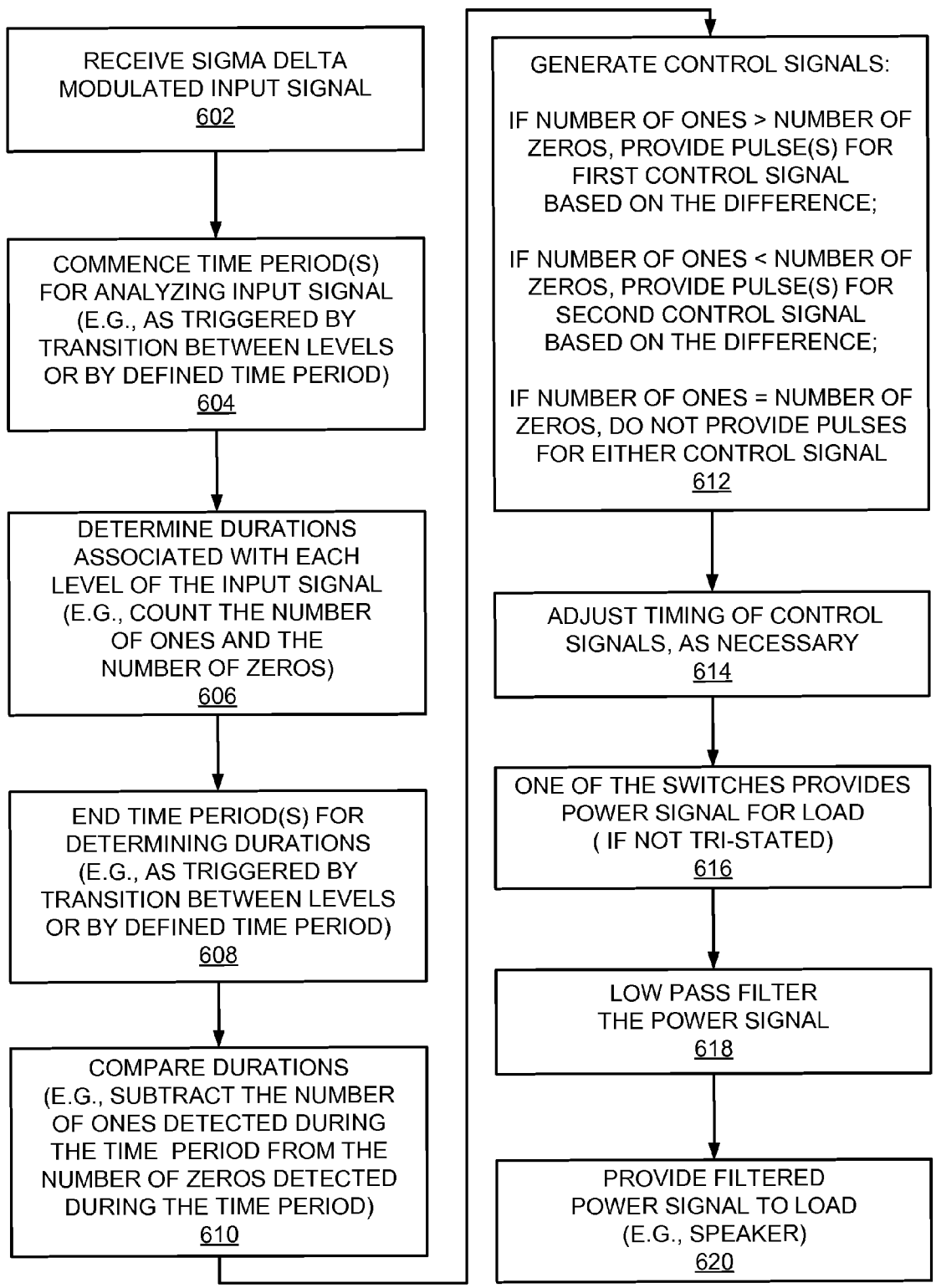
FIG. 6 is a flowchart of several sample aspects of operations that may be performed to generate control signals.

Referring now to FIG. 6, as represented by block 602 the direct drive class-D controller 406 receives a sigma delta modulated input signal 404 from an appropriate signal source. As discussed above in conjunction with block 302, the sigma delta modulated signal 404 may be supplied directly to the apparatus 400 or the apparatus 400 may include a pulse code modulation to sigma delta modulation converter such as converter 210 (not shown in FIG. 4).

As represented by block 604, at some point, a time period commences for analyzing or otherwise acquiring signal level information from the input signal 404. As discussed above, such a time period may be based on transitions between levels of the input signal 404 or may be based on one or more defined periods of time.

FIG. 5 illustrates several time periods that are based on transitions between successive low-level (e.g., having a value of "0") and high-level (e.g., having a value of "1") portions of the input signal 404. For example, the time periods represented by arrowed lines W0, W2, and W4 define a set of successive time periods that commence when the input signal 404 transitions from a low-level to a high-level.

As represented by block 606 in FIG. 6, the controller 406 determines the duration associated with each level of the input signal 404. Various techniques and corresponding structures may be employed to determine these durations. For example, in some implementations the controller 406 comprises a pulse counter 414 that counts the number of pulses or bits (e.g., ones and zeros) associated with each level of the input signal 404.

As represented by block 608, the pulse counter 414 counts the pulses until the end of a given time period is reached. Here, the end of a given time period may be defined in the same manner as the beginning of the time period (e.g., by a transition of an input signal or as a defined amount of time after the start time)

As mentioned above, FIG. 5 illustrates three consecutive time periods W0, W2, and W4. Here, the time period W0 includes time periods P0 and P1 where the input signal 404 consists of five consecutive high-level pulses followed by three consecutive low-level pulses, respectively. Similarly, the time period W2 includes time periods P2 and P3 where the input signal 404 consists of four consecutive high-level pulses and five consecutive low-level pulses, respectively. In addition, the time period W4 includes time periods P4 and P5 where the input signal 404 consists of seven consecutive high-level pulses and three consecutive low-level pulses, respectively.

As represented by block 610, the controller 406 may compare the durations of the levels within a given time period to generate an indication regarding the relative durations of the levels. Various techniques may be employed for comparing the durations of the levels or for generating the indication in some other manner. For example, in some implementations the counts generated by the counter 414 at block 606 may be provided to a comparator (e.g., comparator 214 of FIG. 1) that subtracts the number of pulses of one level (e.g., the three pulses for the time period P1) from the number of pulses of another level (e.g., the five pulses for the time period P0). In other implementations an up/down counter scheme may be used to determine the difference in the number of pulses associated with different levels of the input signal 404. For example, the five pulses for the time period P0 may be used to up count while the three pulses for the time period P1 may be used to down count.

As represented by block 612, the resulting indication as to any difference between the durations of the levels of the input signal 404 are provided to a control pulse generator 416 that generates the control signals 402A and 402B based this indication. In the example of FIG. 5, the control signals 402A and 402B are generated based on the pulses of time periods W0, W2, and W4. In particular, a negative-going pulse may be generated for the control signal 402A in the event the number of high-level pulses of a given time period (e.g., time period W0) is greater than the number of low-level pulses of that time period. Conversely, a positive-going pulse may be generated for the control signal 402B in the event the number of high-level pulses of a given time period is less than the number of low-level pulses of that time period. Thus, in the example of FIG. 5, a pulse is generated on the control signal 402A after the time periods W0 and W4 while a pulse is generated on the control signal 402B after time period W2.

FIG. 5 also illustrates that the widths of the control signals 402A and 402B may be based on pulses of the time periods W0, W2, and W4. For example, the width of a given control signal may be based on the difference between the number of high-level pulses and low-level pulses within a corresponding time period. Thus, in the example of FIG. 5, the first pulse of the control signal 402A has a width of two pulses because the time period P0 had five high-level pulses and the time period P1 had three low-level pulses. Similarly, the pulse of the control signal 402B following the time period W2 has a width of one pulse because the time period P2 had four high-level pulses and the time period P3 had five low-level pulses.

The control signals 402A and 402B may be generated in a variety of ways. For example, in some implementations the resulting count value generated at block 610 may be passed to another counter that down counts to generate a pulse of an appropriate width.

Figure 7:
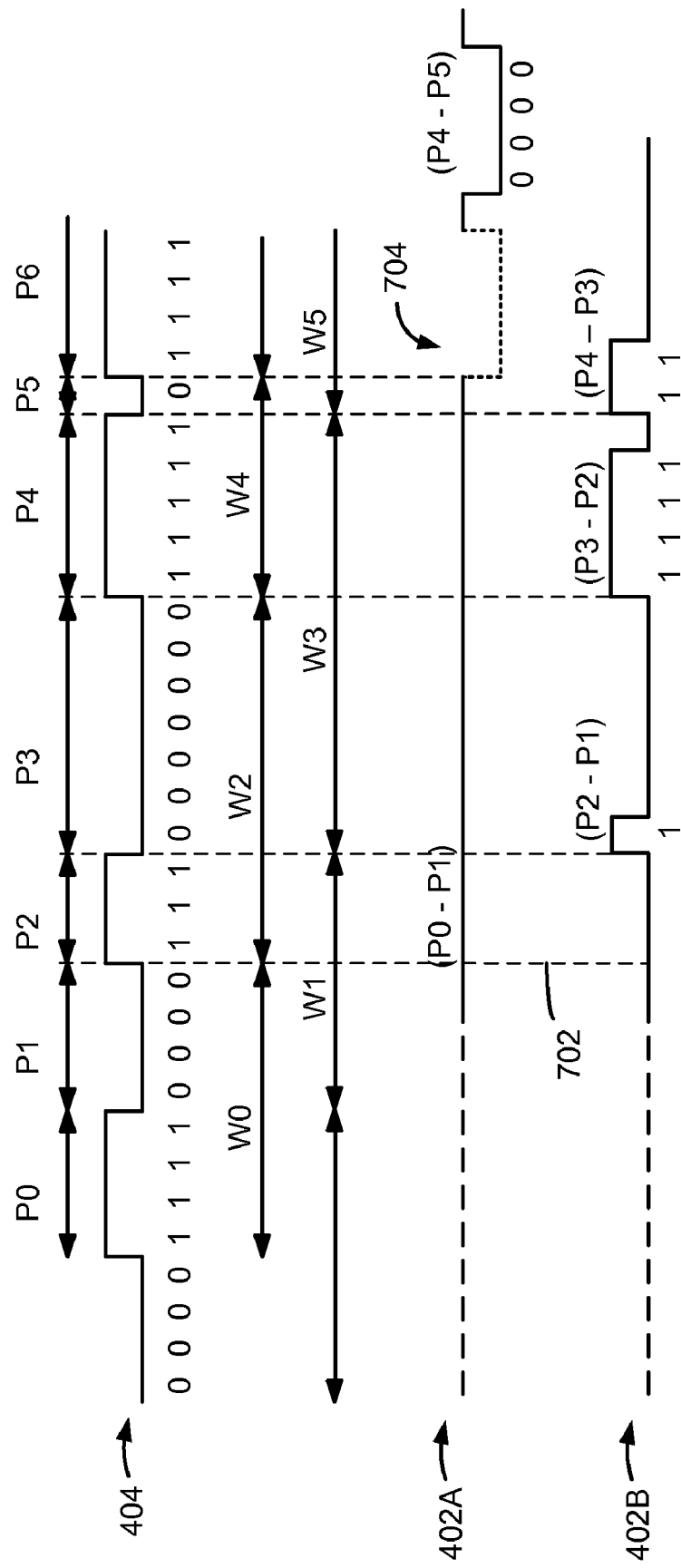
FIG. 7 is a simplified diagram of several sample waveforms relating to the generation of control signals.

Since the control signals 402A and 402B independently control the switches 408A and 408B, the apparatus 400 advantageously provides a tri-stateable class-D type output stage. For example, in the event the durations of successive levels of the waveform data are equal (e.g., representative of silence in an audio signal), both control signals will be off. This scenario is illustrated in FIG. 7 where time period W0 includes four high-level pulses from time period P0 and four low-level pulses from time period P1. In this case, no pulses are provided for the control signals 402A and 402B at the point in time following time period W0 (as represented by the dashed line 702) where a pulse corresponding to P0-P1 would otherwise be provided.

The controller 406 thus provides control signals that provide one state that turns one switch on, another state that turns the other switch on, and yet another state that does not turn either of the switches on. The use of such a tri-state technique enables the power consumption of the apparatus 400 to be substantially proportional to the volume and activity level of, for example, an audio signal represented by the input signal 404. For example, when the audio signal is silent the switches 408A at 408B will be off due to the symmetry between the number of ones and zeros in the input signal 404. In contrast, as the amplitude of the audio signal increases, the asymmetry between the number of ones and zeros in the input signal 404 will increase, thereby causing the switches 408A and 408B to be turned on for longer periods of time.

It should be appreciated that the control signals 402A and 402B may be generated based on other timing relationships. For example, in some implementations the control signals 402A and 402B may be generated based on the sets of pulses associated with time periods W1, W3, W5, and so on of FIG. 4.

In addition, in some applications the control signals 402A and 402B may be generated based on more than one time period. For example, the control signals 402A and 402B may be based on the even time windows (W0, W2, W4, etc.) and the odd time windows (W1, W3, W5, etc.), thereby potentially doubling the number of pulses output on the control signals 402A and 402B. In some aspects, such an increase in the density of the pulses may improve the quality (e.g., the sound quality) of the signal that is ultimately output by the apparatus 400. FIG. 7 illustrates an example where the control signals 402A and 402B are based on both even and odd time windows. Here, the time periods W1, W2, and W3 each result in pulses on the control signal 402B.

As represented by block 614 in FIG. 6, in some aspects it may be desirable or necessary to adjust the timing of one or more of the control signals 402A and 402B. Such a timing adjustment may be made, for example, to avoid simultaneous pulses on the control signals 402A and 402B, to increase the randomness of the control signals 402A and 402B, to reduce the likelihood of the presence of nonlinear phase components in a resulting output signal, or for some other reason.

FIG. 7 illustrates an example where the timing of a pulse for the control signal 402A has been adjusted to avoid simultaneous pulses on the control signals 402A and 402B. As represented by the arrow 704 and the dashed pulse of the control signal 402A, it may be observed that the normal timing for the dashed pulse corresponding to the time period W4 would result in partial overlap with the pulse on a control signal 402B for the time period W3. Accordingly, the controller 406 may adjust the timing of the pulse for the control signal 402A to avoid such a "collision."

Figure 8:
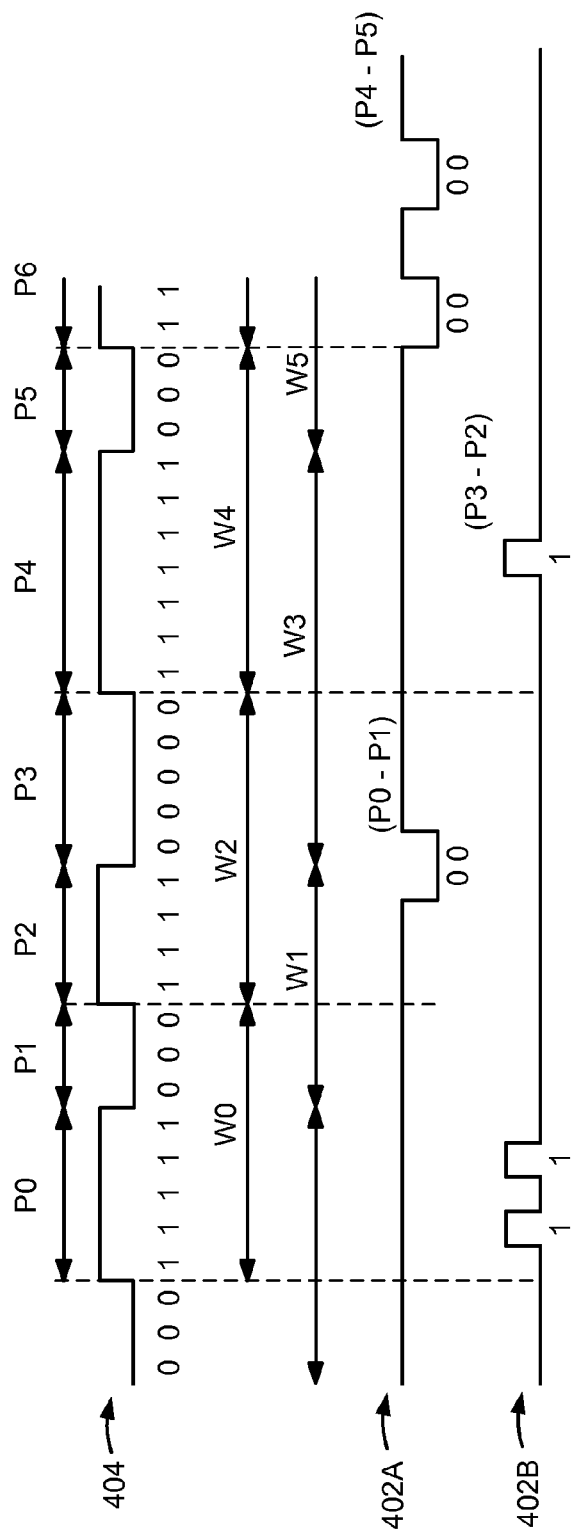
FIG. 8 is a simplified diagram of several sample waveforms relating to the generation of control signals.

FIG. 8 illustrates an example where the timing of pulses for the control signals 402A and 402B has been adjusted to increase the randomness of this timing. Here, it may be observed that the timings between the ends of the time periods (e.g. time periods, W0, W2, and W4) and the beginnings of the corresponding pulses (e.g., the pulses corresponding to P0-P1, P3-P2, and P4-P5) may be adjusted in either a static manner or a dynamic (e.g., a random) manner.

FIG. 8 also illustrates an example where multiple pulses may be used instead of a single pulse for a control signal. In this example, the pulse for the control signal 402A corresponding to time period W4 is slated to be four bits long. Here, the number of bits may correspond to the difference between the number of individual pulses of the levels of the input signal as discussed above. As illustrated in FIG. 8, rather than generate one pulse that is four bits long, the controller 406 may generate two pulses each of which is two bits in length. It should be appreciated that any pulse that is more than a single bit may be divided into any suitable number of pulses. For example, a pulse four bits long may be divided into two, three, or four pulses that, in total, comprise four bits. In some aspects a decision whether to divide a pulse may be based on whether the width of the pulse exceeds a threshold. Such a threshold may correspond to, for example, a threshold quantity of bits (e.g., individual pulses)

As represented by block 616, in the event the output is not tri-stated, one of the switches 408A or 408B is turned on and provides a power signal to the load 410. In the event the output is tri-stated, both of the switches 408A and 408B are turned off. As represented by block 618, any signal generated by the switches 408A and 408B may be provided to the low pass filter 412 or processed in some other manner to improve the characteristics of this signal.

As represented by block 620, the filtered signal is then provided to the load 410. In this example, the load 410 comprises a speaker. As discussed above, however, it should be appreciated that the load 410 may take other forms including, for example, an antenna or some other form of transducer.

Figure 9:
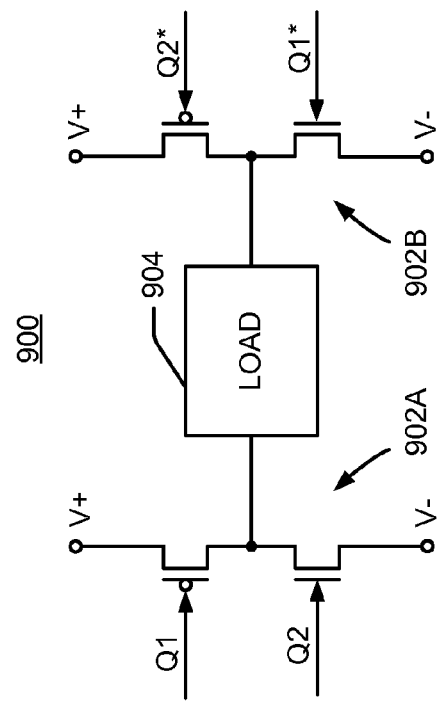
FIG. 9 is a simplified diagram of several sample aspects of a type of output stage.

It also should be appreciated that an output stage (e.g., including the switches 408A and 408B and the load 410) may take various forms. For example, as illustrated in FIG. 9, in some implementations the output stage may comprise an H-bridge 900 including two switch pairs 902A and 902B where each switch pair is coupled to a unique one of the two input terminals of the load 904 (e.g., a transducer). In the example of FIG. 9, control signals Q1 and Q2 may correspond to the control signals 402A and 402B, respectively. In addition, control signals Q1* and Q2* may correspond to inverted control signals 402A and 402B, respectively. Through the use of the H-bridge 900, a larger signal swing (e.g., V+ to V−) may be provided to the load 904. In some implementations a tri-stated condition for the H-bridge 900 may be realized by only turning on the top P-MOS transistors or, alternatively, only turning on the bottom N-MOS transistors. Such a configuration may maintain a more consistent output impedance to the load.

From the above it may be appreciated that the controller 406 substantially maps the bits of the signal delta modulated signal to an output stage that is controlled in an on/off manner. Thus, this technique does not involve reconstructing an analog waveform from the signal delta modulated data as in some conventional signal delta modulation class-D amplifiers (e.g., as in FIG. 1). By eliminating this processing operation, the apparatus 400 may advantageously consume less power than a conventional apparatus that performs such processing.

Moreover, through the use of the tri-state control scheme, the switches 408A and 408B may be turned off when, for example, a binary input signal is substantially oscillating between a "1" and a "0" over a short duration (e.g., indicative of no underlying analog signal). Hence, the disclosed technique also may consume less power than a technique that provides a sigma delta modulated signal directly to a class-D output stage as discussed above.

Figure 10:
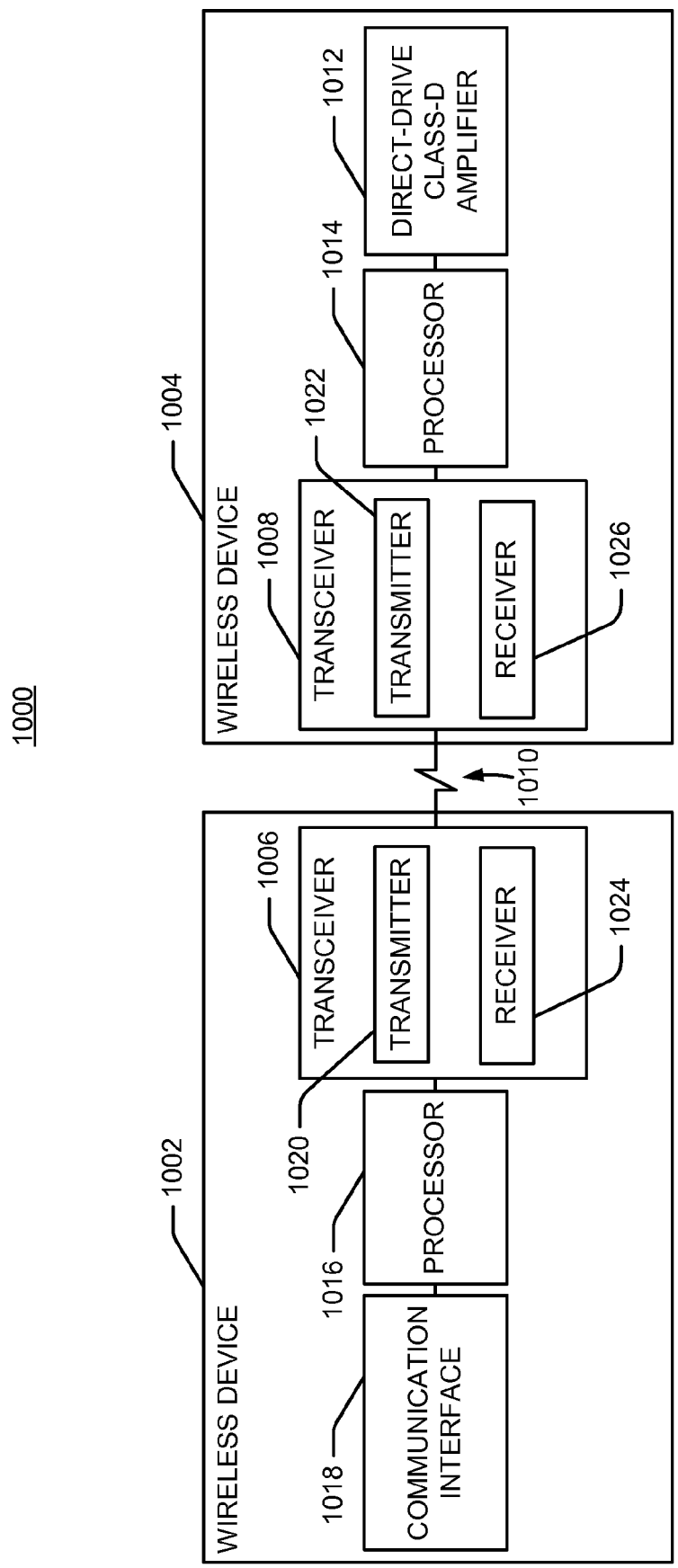
FIG. 10 is a simplified block diagram of several sample aspects of a communication system.

The teachings herein may be utilized in various applications. FIG. 10 illustrates an example of a system 1000 including wireless devices 1002 and 1004. The devices 1002 and 1004 include transceivers 1006 and 1008, respectively, to communicate via one or more wireless communication links 1010.

The device 1004 includes a direct drive class-D amplifier 1012 (or any other similar configuration taught herein) that may be used to drive a load to, for example, provide some form of output signal. Data comprising the input signal for the amplifier 1012 may be provided by the device 1004 or received from the device 1002. In the former scenario, a processor 1014 or some other suitable component may generate the data by, for example, retrieving the data from a data memory (not shown) and processing the data as necessary.

In the latter scenario, the device 1002 (e.g., a processor 1016) may generate the data in a similar manner or the device 1002 may receive the data from another device via, for example, a communication interface 1018. The communication interface 1018 may communicate with the other device via a wired or wireless local area or wide area network (e.g., the Internet or a cellular network) or some other suitable communication link. In either event, the device 1002 sends the data to the device 1004 via the communication link 1010.

In some implementations the device 1002 comprises a wireless station such as cell phone or an entertainment device (e.g., a music player) and the device 1004 comprises a peripheral for the wireless station (e.g., a headset, a watch, or a medical device). In this case, the device 1002 may send signals to the device 1004 to be output by the amplifier 1012. For example, the device 1002 may generate or receive waveform data (e.g., audio data) and send the data to the wireless device 1004 in the form of sigma delta modulated signals or pulse code modulated signals. Upon receipt of the signals, the amplifier 1012 may generate an output signal or otherwise drive a load as taught herein. It should be appreciated that the amplifier 1012 or some similar component may be implemented in the device 1002 depending on the needs of a given application.

Through the use of the amplifier 1012, a wireless device (e.g., device 1004) may provide a desired level of performance yet do so in a manner that consumes a relatively small amount of power. Consequently, the wireless device may be made smaller since a smaller battery may be used and may require relatively infrequent battery charges or battery replacement.

A wireless device may include various components that perform functions based on signals that are transmitted by or received at the wireless device. For example, a headset may include a transducer, wherein the switches (e.g., of the amplifier 1012) are coupled to alternately provide power to the transducer. A watch also may include a transducer, wherein the switches are coupled to alternately provide power to the transducer. In addition, a medical device may include a transducer, wherein the switches are coupled to alternately provide power to the transducer.

The wireless devices may support or otherwise use various wireless communication links and wireless network topologies. For example, in some aspects the wireless devices may comprise or form part of a body area network or a personal area network (e.g., an ultra-wideband network). In addition, in some aspects wireless devices may comprise or form part of a local area network or a wide area network. A wireless device also may support or otherwise use one or more of a variety of wireless communication protocols or standards including, for example, CDMA, TDMA, OFDM, OFDMA, WiMAX, Wi-Fi, and other wireless technologies. Accordingly, a wireless device may include appropriate components (e.g., air interfaces) to establish one or more communication links using the above or other wireless technologies. For example, a device may comprise a wireless transceiver (e.g., a radio) with associated transmitter and receiver components (e.g., transmitters 1020 and 1022 and receivers 1024 and 1026) that include various components (e.g., signal generators and signal processors) that facilitate communication over a wireless medium.

In some aspects a wireless device may communicate via a pulsed-based physical layer. For example, the physical layer may utilize ultra-wideband pulses that have a relatively short length (e.g., on the order of a few nanoseconds) and a relatively wide bandwidth. In some aspects each of the ultra-wideband pulses may have a fractional bandwidth on the order of approximately 20% or more and/or have a bandwidth on the order of approximately 500 MHz or more.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA"), an entertainment device (e.g., a music or video device), a headset (e.g., headphones, an earpiece, etc.), a microphone, a medical device (e.g., a biometric sensor, a heart rate monitor, a pedometer, an EKG device, etc.), a user I/O device (e.g., a watch, a remote control, a light switch, a keyboard, a mouse, etc.), a tire pressure monitor, a computer, a point-of-sale device, an entertainment device, a hearing aid, a set-top box, or any other suitable device.

These devices may have different power and data requirements. In some aspects, the teachings herein may be adapted for use in low power applications (e.g., through the use of a pulse-based signaling scheme and low duty cycle modes) and may support a variety of data rates including relatively high data rates (e.g., through the use of high-bandwidth pulses).

In some aspects a wireless device as described herein may comprise an access device (e.g., a Wi-Fi access point) for a communication system. For example, a device may provide connectivity to another network (e.g., a wide area network such as the Internet) via a wired or wireless communication link. Accordingly, one device may enable another device (e.g., a Wi-Fi station) to access the other network. In addition, it should be appreciated that one or both of the devices may be portable or, in some cases, relatively non-portable.

Figure 11:
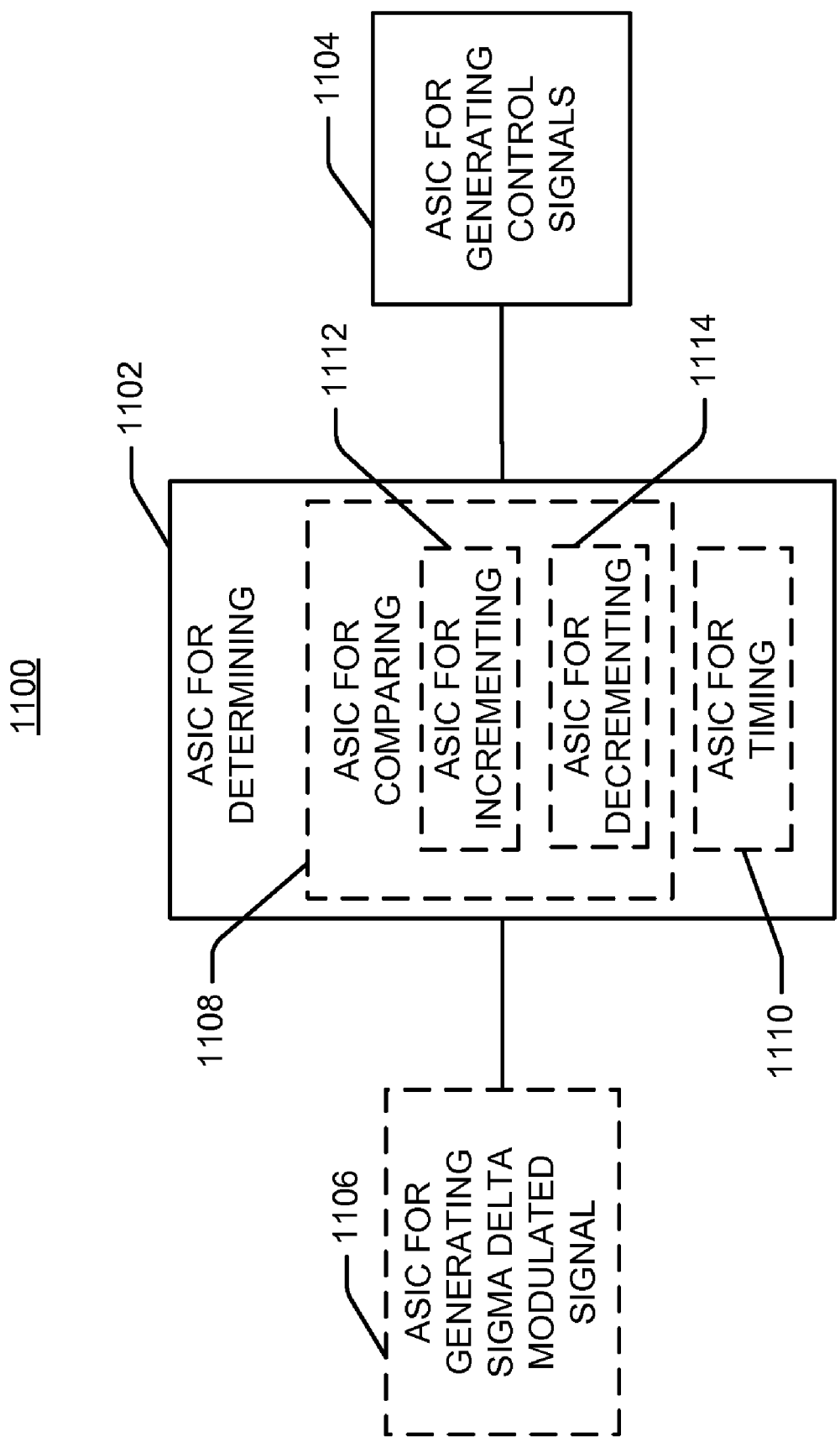
FIG. 11 is a simplified block diagram of several sample aspects of an apparatus for generating control signals.

The components described herein may be implemented in a variety of ways. Referring to FIG. 11, an apparatus 1100 is represented as a series of interrelated functional blocks that may represent functions implemented by, for example, one or more integrated circuits (e.g., an ASIC) or may be implemented in some other manner as taught herein. As discussed herein, an integrated circuit may include a processor, software, other components, or some combination thereof.

As shown in FIG. 11, the apparatus 1100 may include one or more modules 1102, 1104, 1106, 1108, 1110, 1112, and 1114 that may perform one or more of the functions described above with regard to various figures. For example, an ASIC for determining 1102 may provide in various functionality relating to determining relative durations of levels of a signal and may correspond to, for example, component 212 discussed above. An ASIC for generating control signals 1104 may provide functionality relating to generating control signals as taught herein and may correspond to, for example, component 220 discussed above. An ASIC for generating sigma delta modulated signal 1106 may provide various functionality relating to generating a sigma delta modulated signal as taught herein and may correspond to, for example, component 210 discussed above. An ASIC for comparing 1108 may provide various functionality relating to comparing durations of levels of a signal as taught herein and may correspond to, for example, component 214 discussed above. An ASIC for timing 1110 may provide various functionality relating to controlling time periods as taught herein and may correspond to, for example, component 218 discussed above. An ASIC for incrementing 1112 may provide various functionality relating to counting as taught herein and may correspond to, for example, component 216 discussed above. An ASIC for decrementing 1114 may provide various functionality relating to counting as taught herein and may correspond to, for example, component 216 discussed above.

As noted above, in some aspects these components may be implemented via appropriate processor components. These processor components may in some aspects be implemented, at least in part, using structure as taught herein. In some aspects a processor may be adapted to implement a portion or all of the functionality of one or more of these components. In some aspects one or more of the components represented by dashed boxes are optional.

As noted above, the apparatus 1100 may comprise one or more integrated circuits that provide the functionality of the components illustrated in FIG. 11. For example, in some aspects a single integrated circuit may implement the functionality of the illustrated components, while in other aspects more than one integrated circuit may implement the functionality of the illustrated components.

In addition, the components and functions represented by FIG. 11, as well as other components and functions described herein, may be implemented using any suitable means. Such means also may be implemented, at least in part, using corresponding structure as taught herein. For example, in some aspects means for determining may comprise a determiner, means for generating control signals may comprise a control signal generator, means for generating sigma delta modulated signal may comprise a signal converter, means for comparing may comprise a comparator, means for timing may comprise a time controller, means for incrementing may comprise a counter, and means for decrementing may comprise a counter. One or more of such means also may be implemented in accordance with one or more of the processor components of FIG. 11.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. A method of controlling a plurality of switches that are coupled, comprising:
    determining at least one difference associated with time durations of different levels of an input signal over at least one period of time; and
    generating a plurality of control signals based on the at least one difference, wherein the plurality of control signals independently control the switches.

2. The method of claim 1, wherein the plurality of control signals turn off the switches if the time durations are identical or substantially identical.

3. The method of claim 1, wherein:
    the determination comprises comparing the duration of a first one of the levels with the duration of a second one of the levels; and
    the generation of the plurality of control signals comprises determining, based on the comparison, whether to provide at-least one pulse for at least one of the plurality of control signals.

4. The method of claim 3, wherein the comparison comprises subtracting the duration of the first one of the levels from the duration of the second one of the levels.

5. The method of claim 1, wherein:
    at least two of the levels of the input signal are each defined by at least one pulse;
    the determination comprises comparing a quantity of pulses associated with a first one of the levels with a quantity of pulses associated with a second one of the levels; and
    the generation of the plurality of control signals comprises determining, based on the comparison, whether to provide at least one pulse for at least one of the plurality of control signals.

6. The method of claim 5, wherein the comparison comprises subtracting the quantity of pulses associated with the first one of the levels from the quantity of pulses associated with the second one of the levels.

7. The method of claim 6, wherein a duration of at least one of the plurality of control signals is based on a difference between the quantity of pulses associated with the first one of the levels and the quantity of pulses associated with the second one of the levels.

8. The method of claim 6, wherein the comparison comprises: incrementing a count based on the quantity of pulses associated with the first one of the levels; and
    decrementing the count based on the quantity of pulses associated with the second one of the levels.

9. The method of claim 6, wherein each pulse comprises a digital representation of one of the signal levels.

10. The method of claim 1, wherein the at least one period of time commences and ends at times that substantially correspond to transitions between the levels of the input signal.

11. The method of claim 1, wherein the at least one period of time comprises at least one defined period of time.

12. The method of claim 1, wherein:
    the at least one period of time comprises a plurality of periods of time;
    the determination comprises comparing durations within each of the periods of time; and the plurality of control signals are generated based on each comparison for each of the periods of time.

13. The method of claim 12, wherein the periods of time partially overlap in time.

14. The method of claim 1, wherein:
the plurality of control signals comprise pulses; and
the generation of the plurality of control signals comprises adjusting transmission times of the pulses of the plurality of control signals.

15. The method of claim 14, wherein the adjustment is based on whether there would be a collision between pulses of different ones of the plurality of control signals.

16. The method of claim 14, wherein the adjustment is based on whether a quantity of the pulses for a given one of the plurality of control signals exceeds a threshold quantity.

17. The method of claim 1, wherein:
the plurality of control signals comprise pulses; and
the generation of the plurality of control signals comprises randomly distributing the pulses of the plurality of control signals over time.

18. The method of claim 1, wherein:
the at least one period of time comprises a first period of time; and
the generation of the plurality of control signals comprises providing multiple pulses separated in time for at least one of the plurality of control signals if there is a difference between the durations associated with the levels of the input signal over the first period of time.

19. The method of claim 1, wherein the plurality of control signals comprise:
at least one first control signal adapted to control a first set of at least one of the switches; and
at least one second control signal adapted to control a second set of at least one of the switches.

20. The method of claim 1, wherein the input signal comprises a pulse width modulated signal, a delta modulated signal, a pulse density modulated signal, or a sigma delta modulated signal.

21. The method of claim 20, further comprising generating the sigma delta modulated signal based on a pulse code modulated signal.

22. The method of claim 1, wherein the input signal comprises a signal that is not quantized in time.

23. The method of claim 1, wherein the switches are coupled to alternately provide power to a load.

24. The method of claim 23, wherein the switches are coupled to the load via a filter.

25. The method of claim 23, wherein the load comprises a speaker, a transducer, or an antenna.

26. The method of claim 1, wherein the switches comprise at least a portion of a class-D amplifier.

27. The method of claim 1, wherein the switches comprise transistors.

28. The method of claim 1, wherein:
the switches comprise at least a portion of a class-D amplifier;
the levels comprise a first level and a second level;
the plurality of control signals comprise a first control signal and a second control signal;
the input signal comprises a delta modulated signal defining a stream of bits, wherein each bit is associated with either the first level or the second level;
the determination comprises comparing a quantity of the bits associated with the first level with a quantity of the bits associated with the second level; and the generation of the plurality of control signals comprises determining, based on the comparison, whether to provide at least one pulse for at least one of the plurality of control signals.

29. The method of claim 28, wherein the plurality of control signals turn off the switches if the quantity of bits associated with the first level over the at least one time period is identical to the quantity of bits associated with the second level over the at least one time period.

30. An apparatus for controlling a plurality of switches that are coupled, comprising:
a determiner adapted to determine at least one difference associated with time durations of different levels of an input signal over at least one period of time; and
a signal generator adapted to generate a plurality of control signals based on the at least one difference, wherein the plurality of control signals independently control the switches.

31. The apparatus of claim 30, wherein the plurality of control signals are adapted to turn off the switches if the time durations are identical or substantially identical.

32. The apparatus of claim 30, wherein:
the determiner comprises a comparator adapted to compare the duration of a first one of the levels with the duration of a second one of the levels; and
the signal generator is further adapted to determine, based on the comparison, whether to provide at least one pulse for at least one of the plurality of control signals.

33. The apparatus of claim 32, wherein the comparator is adapted to subtract the duration of the first one of the levels from the duration of the second one of the levels.

34. The apparatus of claim 30, wherein:
at least two of the levels of the input signal are each defined by at least one pulse;
the determiner comprises a comparator adapted to compare a quantity of pulses associated with a first one of the levels with a quantity of pulses associated with a second one of the levels; and
the signal generator is further adapted to determine, based on the comparison, whether to provide at least one pulse for at least one of the plurality of control signals.

35. The apparatus of claim 34, wherein the comparator is adapted to subtract the quantity of pulses associated with the first one of the levels from the quantity of pulses associated with the second one of the levels.

36. The apparatus of claim 35, wherein a duration of at least one of the plurality of control signals is based on a difference between the quantity of pulses associated with the first one of the levels and the quantity of pulses associated with the second one of the levels.

37. The apparatus of claim 35, wherein the comparator comprises a counter adapted to:
increment a count based on the quantity of pulses associated with the first one of the levels; and
decrement the count based on the quantity of pulses associated with the second one of the levels.

38. The apparatus of claim 35, wherein each pulse comprises a digital representation of one of the signal levels.

39. The apparatus of claim 30, further comprising a time period controller adapted to commence and end the at least one period of time at times that substantially correspond to transitions between the levels of the input signal.

40. The apparatus of claim 30, further comprising a time period controller adapted to commence and end the at least one period of time according to at least one defined period of time.

41. The apparatus of claim 30, wherein:
the at least one period of time comprises a plurality of periods of time;
the determiner comprises a comparator adapted to compare durations within each of the periods of time; and
the signal generator is further adapted to generate the plurality of control signals based on each comparison for each of the periods of time.

42. The apparatus of claim 41, wherein the periods of time partially overlap in time.

43. The apparatus of claim 30, wherein:
the plurality of control signals comprise pulses; and
the signal generator is further adapted to adjust transmission times of the pulses of the plurality of control signals.

44. The apparatus of claim 43, wherein the adjustment is based on whether there would be a collision between pulses of different ones of the plurality of control signals.

45. The apparatus of claim 43, wherein the adjustment is based on whether a quantity of the pulses for a given one of the plurality of control signals exceeds a threshold quantity.

46. The apparatus of claim 30, wherein:
the plurality of control signals comprise pulses; and
the signal generator is further adapted to randomly distribute the pulses of the plurality of control signals over time.

47. The apparatus of claim 30, wherein:
the at least one period of time comprises a first period of time; and
the signal generator is further adapted to provide multiple pulses separated in time for at least one of the plurality of control signals if there is a difference between the durations associated with the levels of the input signal over the first period of rime.

48. The apparatus of claim 30, wherein the plurality of control signals comprise:
at least one first control signal adapted to control a first set of at least one of the switches; and
at least one second control signal adapted to control a second set of at least one of the switches.

49. The apparatus of claim 30, wherein the input signal comprises a pulse width modulated signal, a delta modulated signal, a pulse density modulated signal, or a sigma delta modulated signal.

50. The apparatus of claim 49, further comprising a converter adapted to generate the sigma delta modulated signal based on a pulse code modulated signal.

51. The apparatus of claim 30, wherein the input signal comprises a signal that is not quantized in time.

52. The apparatus of claim 30, wherein the switches are coupled to alternately provide power to a load.

53. The apparatus of claim 52, wherein the switches are coupled to the load via a filter.

54. The apparatus of claim 52, wherein the load comprises a speaker, a transducer, or an antenna.

55. The apparatus of claim 30, wherein the switches comprise at least a portion of a class-D amplifier.

56. The apparatus of claim 30, wherein the switches comprise transistors.

57. The apparatus of claim 30, wherein:
the switches comprise at least a portion of a class-D amplifier;
the levels comprise a first level and a second level;
the plurality of control signals comprise a first control signal and a second control signal;
the input signal comprises a delta modulated signal defining a stream of bits, wherein each bit is associated with either the first level or the second level;
the determiner comprises a comparator adapted to compare a quantity of the bits associated with the first level with a quantity of the bits associated with the second level; and
the signal generator is further adapted to determine, based on the comparison, whether to provide at least one pulse for at least one of the plurality of control signals.

58. The apparatus of claim 57, wherein the plurality of control signals are adapted to turn off the switches if the quantity of bits associated with the first level over the at least one time period is identical to the quantity of bits associated with the second level over the at least one time period.

59. An apparatus for controlling a plurality of switches that are coupled, comprising:
means for determining at least one difference associated with time durations of different levels of an input signal over at least one period of time; and
means for generating a plurality of control signals based on the at least one difference, wherein the plurality of control signals independently control the switches.

60. The apparatus of claim 59, wherein the plurality of control signals are adapted to turn off the switches if the time durations are identical or substantially identical.

61. The apparatus of claim 59, wherein:
the means for determining comprises means for comparing the duration of a first one of the levels with the duration of a second one of the levels; and
the means for generating plurality of control signals determines, based on the comparison, whether to provide at least one pulse for at least one of the plurality of control signals.

62. The apparatus of claim 61, wherein the means for comparing subtracts the duration of the first one of the levels from the duration of the second one of the levels.

63. The apparatus of claim 59, wherein:
at least two of the levels of the input signal are each defined by at least one pulse;
the means for determining comprises means for comparing a quantity of pulses associated with a first one of the levels with a quantity of pulses associated with a second one of the levels; and
the means for generating the plurality of control signals determines, based on the comparison, whether to provide at least one pulse for at least one of the plurality of control signals.

64. The apparatus of claim 63, wherein the means for comparing subtracts the quantity of pulses associated with the first one of the levels from the quantity of pulses associated with the second one of the levels.

65. The apparatus of claim 64, wherein a duration of at least one of the plurality of control signals is based on a difference between the quantity of pulses associated with the first one of the levels and the quantity of pulses associated with the second one of the levels.

66. The apparatus of claim 64, wherein the means for comparing comprises:
means for incrementing a count based on the quantity of pulses associated with the first one of the levels; and
means for decrementing the count based on the quantity of pulses associated with the second one of the levels.

67. The apparatus of claim 64, wherein each pulse comprises a digital representation of one of the signal levels.

68. The apparatus of claim 59, further comprising means for timing to commence and end the at least one period of time at times that substantially correspond to transitions between the levels of the input signal.

69. The apparatus of claim 59, further comprising means for timing to commence and end the at least one period of time according to at least one defined period of time.

70. The apparatus of claim 59, wherein:
the at least one period of time comprises a plurality of periods of time;
the means for determining comprises means for comparing durations within each of the periods of time; and
the means for generating the plurality of control signals generates the plurality of control signals based on each comparison for each of the periods of time.

71. The apparatus of claim 70, wherein the periods of time partially overlap in time.

72. The apparatus of claim 59, wherein:
the plurality of control signals comprise pulses; and
the means for generating the plurality of control signals adjusts transmission times of the pulses of the plurality of control signals.

73. The apparatus of claim 72, wherein the adjustment is based on whether there would be a collision between pulses of different ones of the plurality of control signals.

74. The apparatus of claim 72, wherein the adjustment is based on whether a quantity of the pulses for a given one of the plurality of control signals exceeds a threshold quantity.

75. The apparatus of claim 59, wherein:
the plurality of control signals comprise pulses; and
the means for generating plurality of control signals randomly distributes the pulses of the plurality of control signals over time.

76. The apparatus of claim 59, wherein:
the at least one period of time comprises a first period of time; and
the means for generating the plurality of control signals provides multiple pulses separated in time for at least one of the plurality of control signals if there is a difference between the durations associated with the levels of the input signal over the first period of time.

77. The apparatus of claim 59, wherein the plurality of control signals comprise:
at least one first control signal adapted to control a first set of at least one of the switches; and
at least one second control signal adapted to control a second set of at least one of the switches.

78. The apparatus of claim 59, wherein the input signal comprises a pulse width modulated signal, a delta modulated signal, a pulse density modulated signal, or a sigma delta modulated signal.

79. The apparatus of claim 78, further comprising means for generating the sigma delta modulated signal based on a pulse code modulated signal.

80. The apparatus of claim 59, wherein the input signal comprises a signal that is not quantized in time.

81. The apparatus of claim 59, wherein the switches are coupled to alternately provide power to a load.

82. The apparatus of claim 81, wherein the switches are coupled to the load via a filter.

83. The apparatus of claim 81, wherein the load comprises a speaker, a transducer, or an antenna.

84. The apparatus of claim 59, wherein the switches comprise at least a portion of a class-D amplifier.

85. The apparatus of claim 59, wherein the switches comprise transistors.

86. The apparatus of claim 59, wherein:
the switches comprise at least a portion of a class-D amplifier;
the levels comprise a first level and a second level;
the plurality of control signals comprise a first control signal and a second control signal;
the input signal comprises a delta modulated signal defining a stream of bits, wherein each bit is associated with either the first level or the second level;
the means for determining comprises means for comparing a quantity of the bits associated with the first level with a quantity of the bits associated with the second level; and
the means for generating the plurality of control signals determines, based on the comparison, whether to provide at least one pulse for at least one of the plurality of control signals.

87. The apparatus of claim 86, wherein the plurality of control signals are adapted to turn off the switches if the quantity of bits associated with the first level over the at least one time period is identical to the quantity of bits associated with the second level over the at least one time period.

88. A computer-program product stored on the readable medium for controlling a plurality of switches that are coupled, comprising:
computer-readable medium comprising codes executable by at least one computer to:
determine at least one difference associated with time durations of different levels of an input signal over at least one period of time; and
generate a plurality of control signals based on the at least one difference, wherein the plurality of control signals independently control the switches.

89. A headset for wireless communication, comprising:
a plurality of switches that are coupled;
a comparator adapted to determine at least one difference associated with time durations of different levels of an input signal over at least one period of time;
a signal generator adapted to generate a plurality of control signals based on the at least one difference, wherein the plurality of control signals independently control the switches; and
a transducer, wherein the switches are coupled to alternately provide power to the transducer.

90. A watch for wireless communication, comprising:
a plurality of switches that are coupled;
a comparator adapted to determine at least one difference associated with time durations of different levels of an input signal over at least one period of time;
a signal generator adapted to generate a plurality of control signals based on the at least one difference, wherein the plurality of control signals independently control the switches; and
a transducer, wherein the switches are coupled to alternately provide power to the transducer.

91. A medical device for wireless communication, comprising:
a plurality of switches that are coupled;
a comparator adapted to determine at least one difference associated with time durations of different levels of an input signal over at least one period of time;
a signal generator adapted to generate a plurality of control signals based on the at least one difference, wherein the plurality of control signals independently control the switches; and
a transducer, wherein the switches are coupled to alternately provide power to the transducer.

* * * * *